United States Patent
Ko et al.

(10) Patent No.: US 12,451,894 B2
(45) Date of Patent: Oct. 21, 2025

(54) ANALOG-TO-DIGITAL CONVERSION CIRCUIT AND OPERATING METHOD OF THE SAME

(71) Applicant: Samsung Electronics Co., Ltd., Suwon-si (KR)

(72) Inventors: Dongmin Ko, Suwon-si (KR); Jaewoo Park, Suwon-si (KR); Myoungbo Kwak, Suwon-si (KR); Jueon Kim, Suwon-si (KR); Junghwan Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 148 days.

(21) Appl. No.: 18/494,340

(22) Filed: Oct. 25, 2023

(65) Prior Publication Data
US 2024/0250689 A1    Jul. 25, 2024

(30) Foreign Application Priority Data
Jan. 19, 2023   (KR) .................. 10-2023-0008103

(51) Int. Cl.
*H03M 1/06* (2006.01)
*H03M 1/08* (2006.01)
(Continued)

(52) U.S. Cl.
CPC ....... *H03M 1/0604* (2013.01); *H03M 1/0607* (2013.01); *H03M 1/0617* (2013.01);
(Continued)

(58) Field of Classification Search
CPC .. H03M 1/0604; H03M 1/462; H03M 1/0617; H03M 1/089; H03M 1/1009; H03M 1/38; H03M 1/0607; H03M 1/46
(Continued)

(56) References Cited

U.S. PATENT DOCUMENTS 8,786,483 B1 * 7/2014 Thompson .......... H03M 1/0836
                                                    341/161
8,896,476 B2   11/2014 Harpe
(Continued)

FOREIGN PATENT DOCUMENTS

KR   10-2126619 B1   6/2020
KR   10-2276893 B1   7/2021

*Primary Examiner* — Khai M Nguyen
(74) *Attorney, Agent, or Firm* — Harness, Dickey & Pierce, P.L.C.

(57) ABSTRACT

An analog-to-digital conversion circuit includes an analog-to-digital converter (ADC) configured to receive an input signal and a first clock signal from an external source and to output a second clock signal and a digital output signal, a decision counter configured to increment a decision count value each time when the second clock signal received from the analog-to-digital converter is applied to the decision counter, a voltage control logic configured to output a control signal based on a result of comparing the decision count value with a reference count value, and a regulator configured to output an operation voltage, wherein the ADC is configured to adjust the cycle of the second clock signal, and the voltage control logic is configured to control the regulator to output a corrected operating voltage via the control signal.

20 Claims, 12 Drawing Sheets

(51) Int. Cl.
  *H03M 1/10* (2006.01)
  *H03M 1/38* (2006.01)
  *H03M 1/46* (2006.01)

(52) U.S. Cl.
  CPC ......... *H03M 1/089* (2013.01); *H03M 1/1009* (2013.01); *H03M 1/38* (2013.01); *H03M 1/46* (2013.01); *H03M 1/462* (2013.01)

(58) Field of Classification Search
  USPC ................. 341/118, 120, 155, 161, 163, 172
  See application file for complete search history.

(56) References Cited

U.S. PATENT DOCUMENTS

| | | |
|---|---|---|
| 8,957,802 B1 * | 2/2015 | Evans ................. H03M 1/0863 341/161 |
| 9,379,726 B1 | 6/2016 | Wang et al. |
| 9,685,973 B2 | 6/2017 | Liu et al. |
| 9,755,657 B2 | 9/2017 | Baek et al. |
| 10,243,576 B2 | 3/2019 | Fogleman et al. |
| 10,454,492 B1 | 10/2019 | Shikata et al. |
| 10,606,294 B1 | 3/2020 | Kuo et al. |
| 10,644,713 B1 | 5/2020 | Chao |
| 11,190,199 B1 | 11/2021 | Zheng et al. |
| 11,424,753 B2 | 8/2022 | Kim et al. |

* cited by examiner

ANALOG-TO-DIGITAL CONVERSION CIRCUIT AND OPERATING METHOD OF THE SAME

CROSS-REFERENCE TO RELATED APPLICATION

This application is based on and claims priority under 35 U.S.C. § 119 to Korean Patent Application No. 10-2023-0008103, filed on Jan. 19, 2023 in the Korean Intellectual Property Office, the disclosure of which is incorporated by reference herein in its entirety.

BACKGROUND

The inventive concepts relate to analog-to-digital conversion circuits and operating methods thereof, and more particularly, to analog-to-digital conversion circuits including an asynchronous successive approximation register analog-to-digital converter and a voltage controller, and operating methods of the analog-digital converting circuits.

As the data transmission speed by using peripheral component interconnect-express (PCI-E) and Mobile Industry Processor Interface (MIPI)-physical layer (M-PHY) increases, a pulse-amplitude modulation 4 (PAM4) signaling method may be used to transmit data. When transmitting data in the PAM4 signaling method, a structure, in which an analog-to-digital converter (ADC) is combined with a digital signal processor (DSP), may be used.

When the asynchronous successive approximation register analog-to-digital converter converts an analog signal into a digital signal, the speed of the conversion operation may be affected by process voltage temperature (PVT), which may cause performance degradation.

SUMMARY

Some example embodiments of the inventive concepts provide a method of compensating for performance degradation when the performance degradation is generated by process-voltage-temperature (PVT) in an asynchronous successive approximation register analog-to-digital converter.

The issues to be solved by the technical idea of the inventive concepts are not limited to the above-mentioned issues, and other issues not mentioned may be clearly understood by one of ordinary skill in the art from the following descriptions.

According to some example embodiments of the inventive concepts, an analog-to-digital conversion circuit may include an analog-to-digital converter configured to receive an input signal and a first clock signal from an external source that is external to the analog-to-digital converter, generate a second clock signal having a different cycle from the first clock signal, and output the second clock signal and a digital output signal, a decision counter configured to sequentially increase a decision count value each time when the second clock signal received from the analog-to-digital converter is applied to the decision counter, a voltage control logic configured to receive the decision count value from the decision counter, and output a control signal based on a result of comparing the decision count value with a reference count value, and a regulator configured to output an operating voltage based on the control signal received from the voltage control logic, wherein the analog-to-digital converter is configured to control a cycle of the second clock signal based on a magnitude of the operating voltage, and the voltage control logic is configured to control the regulator to output a corrected operating voltage based on using the control signal.

According to some example embodiments of the inventive concepts, a method of correcting an operating voltage of an analog-to-digital converter may include selecting a first voltage of first through $M^{th}$ voltages, which sequentially decrease, as the operating voltage, obtaining a decision count value corresponding to a second clock signal generated by the analog-to-digital converter operating based on the operating voltage, determining to increase or decrease the operating voltage based on a result of comparing the decision count value with a reference count value, and changing the operating voltage based on the result of the comparing, and in response to a determination that the operating voltage is increased, determining the changed operating voltage as a corrected operating voltage, wherein the decision count value corresponds to a number of applications of the second clock signal to the voltage controller during one cycle of the first clock signal received from an external source that is external to the analog-to-digital converter.

According to some example embodiments of the inventive concepts, a method of correcting an operating voltage of an analog-to-digital converter may include selecting a first voltage of first through $M^{th}$ voltages, which sequentially increase, as the operating voltage, obtaining a decision count value corresponding to a second clock signal generated by the analog-to-digital converter operating based on the operating voltage, determining to increase or maintain the operating voltage based on a result of comparing the decision count value with a reference count value, and increasing or maintaining the operating voltage based on the result of the comparing, and in response to a determination that the operating voltage is determined to be maintained, determining the operating voltage as a corrected operating voltage, wherein the decision count value corresponds to a number of applications of the second clock signal to a voltage controller during a cycle of a first clock signal received from an external source that is external to the analog-to-digital converter.

BRIEF DESCRIPTION OF THE DRAWINGS

Example embodiments will be more clearly understood from the following detailed description taken in conjunction with the accompanying drawings in which.

DETAILED DESCRIPTION

Hereinafter, example embodiments of the inventive concepts are described in detail with reference to the accompanying drawings. When descriptions are given with reference to drawings, identical or corresponding components may be given with identical drawing reference numbers, and duplicate descriptions thereof are omitted.

Throughout the specification, when a part is "connected" to another part, it includes not only a case where the part is "directly connected" but also a case where the part is "indirectly connected" with another part in between. In addition, unless explicitly described to the contrary, the word "comprise" and variations such as "comprises" or "comprising" will be understood to imply the inclusion of stated elements but not the exclusion of any other elements.

The use of the term "the" and similar demonstratives may correspond to both the singular and the plural. Operations constituting methods may be performed in any suitable order unless otherwise indicated herein or otherwise clearly contradicted by context and are not necessarily limited to the stated order.

The use of all illustrations or illustrative terms in some example embodiments is simply to describe the technical ideas in detail, and the scope of the present inventive concepts is not limited by the illustrations or illustrative terms unless they are limited by claims.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

Figure 1:
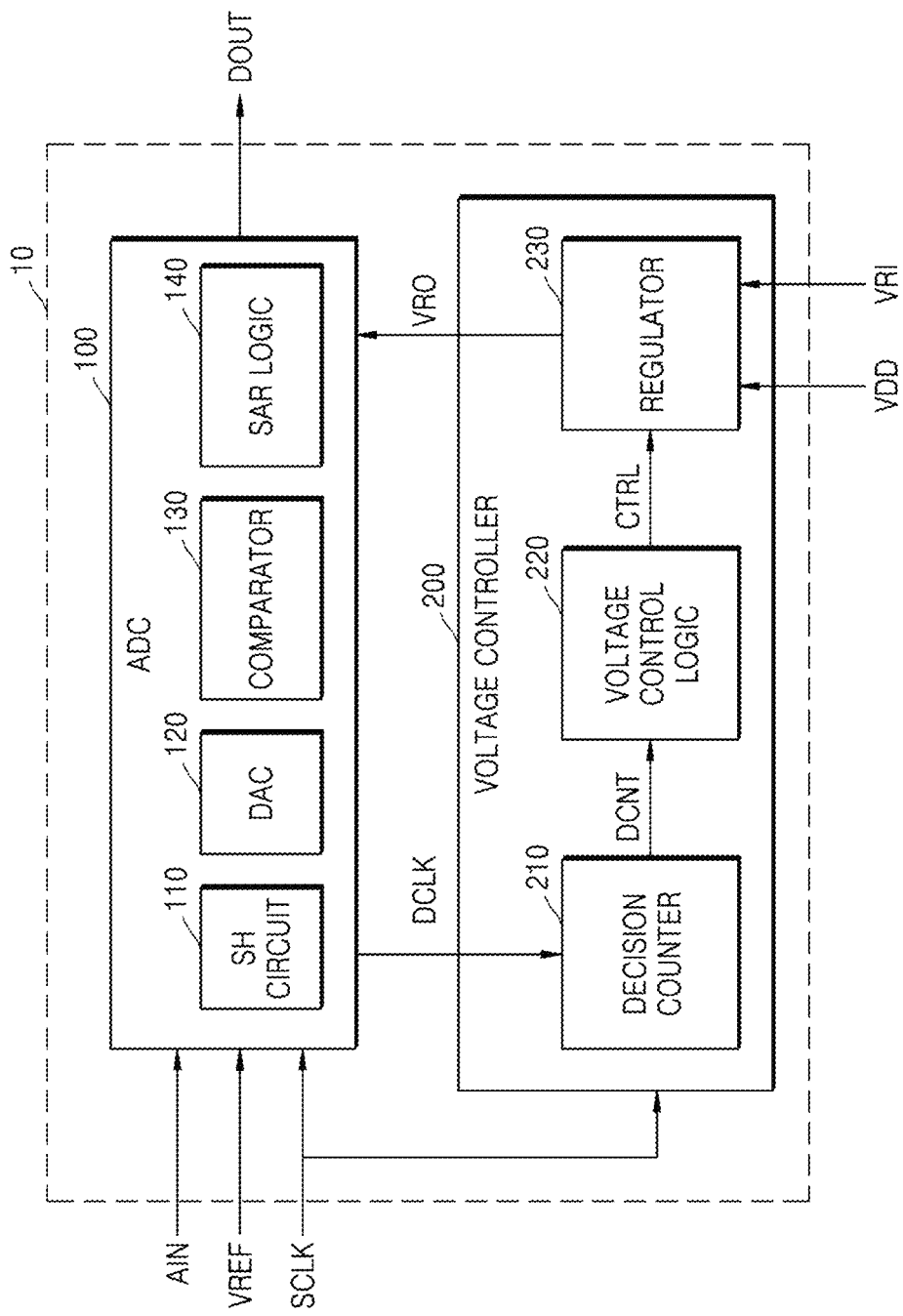
FIG. 1 is a block diagram of an analog-to-digital conversion circuit according to some example embodiments.

FIG. 1 is a block diagram of an analog-to-digital conversion circuit 10 according to some example embodiments.

Referring to FIG. 1, the analog-to-digital conversion circuit 10 may include an analog-to-digital converter (ADC) 100 and a voltage controller 200.

The ADC 100 may include a sample/hold (SH) circuit 110, a digital-to-analog converter (DAC) 120, a comparator 130, and a successive approximation register (SAR) logic 140. In some example embodiments, the ADC 100 may mean an SAR ADC.

The ADC 100 may receive an input signal AIN, a comparison reference voltage VREF, and a first clock signal SCLK from the outside (e.g., an external source that is external to the ADC 100). In some example embodiments, the analog-to-digital conversion circuit 10 may include a phase-locked loop (PLL) circuit (which may be the external source that is external to the ADC 100), and the first clock signal SCLK may include a signal generated by the PLL circuit. In some example embodiments, the input signal AIN may include an analog signal.

The ADC 100 may receive an operating voltage VRO from the voltage controller 200. The ADC 100 may generate a second clock signal DCLK, and transmit the second clock signal DCLK to the voltage controller 200. The ADC 100 may convert the input signal AIN received from the outside into a digital signal, and output (e.g., transmit) the digital signal as an output signal DOUT. In some example embodiments, the output signal DOUT may include a digital signal including N bits (N is a natural number of 1 or more). The N bits of the output signal DOUT may be determined according to the resolution of the ADC 100.

The sample/hold (SH) circuit 110 may operate based on the first clock signal SCLK, sample the input signal AIN, and transmit the sampled input signal AIN to the DAC 120. The DAC 120 may receive the sampled input signal AIN from the SH circuit 110, and generate comparison voltages corresponding to the sampled input signal AIN. The comparator 130 may receive comparison voltages from the DAC 120, and output result signals based on the received comparison voltages.

The SAR logic 140 may generate the second clock signal DCLK having a cycle different from that of the first clock signal SCLK. In some example embodiments, the cycle of the second clock signal DCLK may be less than the cycle of the first clock signal SCLK. In some example embodiments, the second clock signal DCLK may be generated during a time interval between a falling edge of a first cycle of the first clock signal SCLK and a rising edge of a second cycle of the first clock signal SCLK.

The SAR logic 140 may operate based on an operating voltage VRO supplied by the voltage controller 200. The cycle of the second clock signal DCLK generated by the SAR logic 140 may be inversely proportional to the voltage magnitude of the operating voltage VRO. In other words, as the size of the operating voltage VRO supplied to the SAR logic 140 increases, the cycle of the second clock signal DCLK may decrease, and as the size of the operating voltage VRO supplied to the SAR logic 140 decreases, the cycle of the second clock signal DCLK may increase. In some example embodiments, the SAR logic 140 may be referred to as an SAR control logic.

The voltage controller 200 may include a decision counter 210, a voltage control logic 220, and a regulator 230. The voltage controller 200 may receive the first clock signal SCLK from the outside, and may receive the second clock signal DCLK from the ADC 100. The voltage controller 200 may receive a supply voltage VDD and a regulator reference voltage VRI from the outside.

The decision counter 210 may receive the second clock signal DCLK generated by the SAR logic 140 of the ADC 100. The decision counter 210 may count the number (e.g., quantity) of times, at which the second clock signal DCLK is applied (e.g., received at the decision counter 210), during one cycle of the first clock signal SCLK received from the outside, and the number of times counted may be referred to as a decision count value DCNT. In some example embodiments, the decision count value DCNT may be 0 at a falling edge time point of the first cycle of the first clock signal SCLK. Whenever the second clock signal DCLK is applied to the decision counter 210 until the second cycle of the first clock signal SCLK starts (e.g., in response to each application of the second clock signal DCLK to the decision counter 210 between a start time (e.g., falling edge time point) of a given cycle of the first clock signal SCLK and a start time (e.g., rising edge time point) of a next cycle of the first clock signal SCLK), the decision counter 210 may cause the decision count value DCNT to increase sequentially (e.g., increment increasingly). The decision counter 210 may output the decision count value DCNT to the voltage control logic 220 at the rising edge of the next cycle (that is, the second cycle) of the first clock signal SCLK. For example, when the second clock signal DCLK has passed 8 cycles during the first cycle of the first clock signal SCLK, the decision count value DCNT (which may be the decision count value DCNT that is output by the decision counter 210) may be 8. In some example embodiments, the decision counter 210 may store the decision count value DCNT corresponding to the number of applications of the second clock signal DCLK applied (e.g., the number of times the second clock signal DCLK is received at the decision counter 210) in one cycle of the first clock signal SCLK, and the decision counter 210 may transmit the stored decision count value DCNT to the voltage control logic 220.

The regulator 230 may receive a voltage control signal CTRL from the voltage control logic 220, and supply the operating voltage VRO to the ADC 100 based on the received voltage control signal CTRL. In some example embodiments, the regulator 230 may include a low-dropout (LDO) regulator. In some example embodiments, the regulator 230 may select at least one voltage of first through $M^{th}$ voltages (M is a natural number of 2 or more) as the operating voltage VRO, and may supply the selected operating voltage VRO to the ADC 100 (e.g., cause a selected voltage of the first through $M^{th}$ voltages to be selectively transmitted as the operating voltage VRO based on the voltage control signal CTRL). The first through $M^{th}$ voltages may correspond to voltage levels of M steps, which sequentially decrease (e.g., increment decreasingly), or voltage levels of M steps, which sequentially increase (e.g., increment increasingly). In other words, the first through $M^{th}$ voltages may form voltage levels of M steps. In this case, the first through $M^{th}$ voltages may not exceed the magnitude of the supply voltage VDD. The first through $M^{th}$ voltages may be generated based on the regulator reference voltage VRI. For example, the first through $M^{th}$ voltages may have values equal to or greater than the regulator reference voltage VRI.

The voltage control logic 220 may receive the decision count value DCNT from the decision counter 210. The voltage control logic 220 may compare the decision count value DCNT with the reference count value (which may be a value that is stored at a memory of the ADC circuit 10 and which may be accessed by the voltage control logic 220 to perform the comparison), and the voltage control logic 220 may transmit the voltage control signal CTRL to the regulator 230 based on the comparison result.

In some example embodiments, to correct the operating voltage VRO supplied to the ADC 100, the voltage control signal CTRL may include a correction start signal for selecting the initial operating voltage, a correction completion signal for selecting the operating voltage VRO corrected after the completion of a voltage correction operation, a voltage step-up signal for increasing the operating voltage VRO, or a voltage step-down signal for decreasing the operating voltage VRO.

Hereinafter, the corrected operating voltage VRO (also referred to herein as a calibrated operating voltage VRO) may mean a voltage of the smallest magnitude of voltages, output by the regulator 230, without causing performance degradation of the ADC 100.

Hereinafter, when a voltage one step higher than the operating voltage VRO supplied to the ADC 100 is required to be adjusted to the operating voltage VRO and supplied (e.g., selectively transmitted), of the first through $M^{th}$ voltages supplied by the regulator 230, the voltage control signal CTRL transmitted to the regulator 230 by the voltage control logic 220 may be referred to as a voltage step-up signal. Hereinafter, when a voltage one step lower than the operating voltage VRO supplied to the ADC 100 is required to be adjusted to the operating voltage VRO and supplied (e.g., selectively transmitted), of the first through $M^{th}$ voltages supplied by the regulator 230, the voltage control signal CTRL transmitted to the regulator 230 by the voltage control logic 220 may be referred to as a voltage step-down signal.

A reference count value may correspond to the resolution of the ADC 100, and may include a value previously input to the voltage control logic 220 according to the resolution of the ADC 100. For example, when the ADC 100 performs an 8-bit comparison on the input signal AIN, the output signal DOUT may include a value having 8 bits, and in this case, the reference count value may be 8.

The voltage control logic 220 may control the regulator 230 to adjust the operating voltage VRO supplied to the ADC 100, and the ADC 100 may operate based on the corrected operating voltage VRO.

In some example embodiments, the cycle of second clock signal DCLK may be shortened due to the effect of PVT, and as a result, the resolution of the ADC 100 may deteriorate. In this case, the voltage controller 200 may determine correction of the operating voltage VRO.

When the voltage controller 200 decides to correct the operating voltage VRO supplied to the ADC 100, the voltage controller 200 may control the regulator 230 to output the first voltage. In other words, the voltage control logic 220 may transmit the voltage control signal CTRL corresponding to the correction start signal to the regulator 230.

The voltage control logic 220 may receive the decision count value DCNT corresponding to the number of applications of the second clock signal DCLK applied to the decision counter 210 in one cycle of the first clock signal SCLK, from the ADC 100 operating based on the first voltage. The voltage control logic 220 may adjust the operating voltage of the regulator 230 (e.g., control the regulator 230 to adjust the operating voltage VRO that is transmitted by the regulator 230), by comparing the received decision count value DCNT with the reference count value. For example, when (e.g., in response to a determination that) the received decision count value DCNT is less than the reference count value, the voltage control logic 220 may transmit the voltage control signal CTRL corresponding to the voltage step-up signal (also referred to herein as a voltage increase signal) to the regulator 230, and may increase the operating voltage VRO supplied by the regulator 230 to the ADC 100 (e.g., may control the regulator 230 to increase the voltage of the operating voltage VRO that is transmitted by the regulator 230 to the ADC 100). For example, the voltage control logic 220 may control the regulator 230 to change the operating voltage VRO to become a corrected operating voltage VRO that is a voltage higher than the operating voltage VRO by one step of the first through $M^{th}$ voltages based on generating a voltage increase signal and transmitting the voltage increase signal to the regulator 230, in response to a determination that the decision count value DCNT is less than the reference count value. In addition, for example, when the DCNT is equal to or greater than the reference count value, the voltage control logic 220 may transmit the voltage control signal CTRL corresponding to the voltage step-down signal (also referred to herein as a voltage regulator reduction signal) to the regulator 230, and may decrease the operating voltage VRO supplied by the regulator 230 to the ADC 100 (e.g., may control the regulator 230 to decrease the voltage of the operating voltage VRO that is transmitted by the regulator 230 to the ADC 100). For example, the voltage control logic 220 may control the regulator 230 to change the operating voltage VRO to a corrected operating voltage VRO that is a voltage less than the operating voltage VRO by one step of the first through $M^{th}$ voltages based on generating a voltage regulator reduction signal to control the regulator 230, in response to a determination that the decision count value DCNT is equal to or greater than the reference count value.

When the correction on the operating voltage VRO is completed, the voltage control logic 220 may control the regulator 230 based on transmitting the voltage control signal CTRL corresponding to the correction completion signal to the regulator 230. Detailed descriptions of determining the completion of correction of the operating voltage VRO are given below with reference to FIGS. 4 through 5C.

According to some example embodiments, the ADC 100 may improve deteriorated performance by receiving the corrected operating voltage VRO via the voltage controller 200, even when deterioration occurs in the signal conversion performance due to PVT, and may also reduce power required by the ADC 100 for converting the input signal AIN into the output signal DOUT. Accordingly, the functionality of the ADC circuit 10 and any device including same may be improved, based on the ADC circuit 10 being configured to adjust the operating voltage VRO and the second clock signal DCLK used to perform analog-to-digital conversion of a received analog input signal AIN into a digital output signal DOUT to compensate for PVT-based degradation of performance of the ADC circuit 10, based on adjusting the operating voltage, and further based on the ADC circuit 10 being configured to reduce or minimize (e.g., optimize) power consumption to perform the analog-to-digital conversion.

Figure 2A:
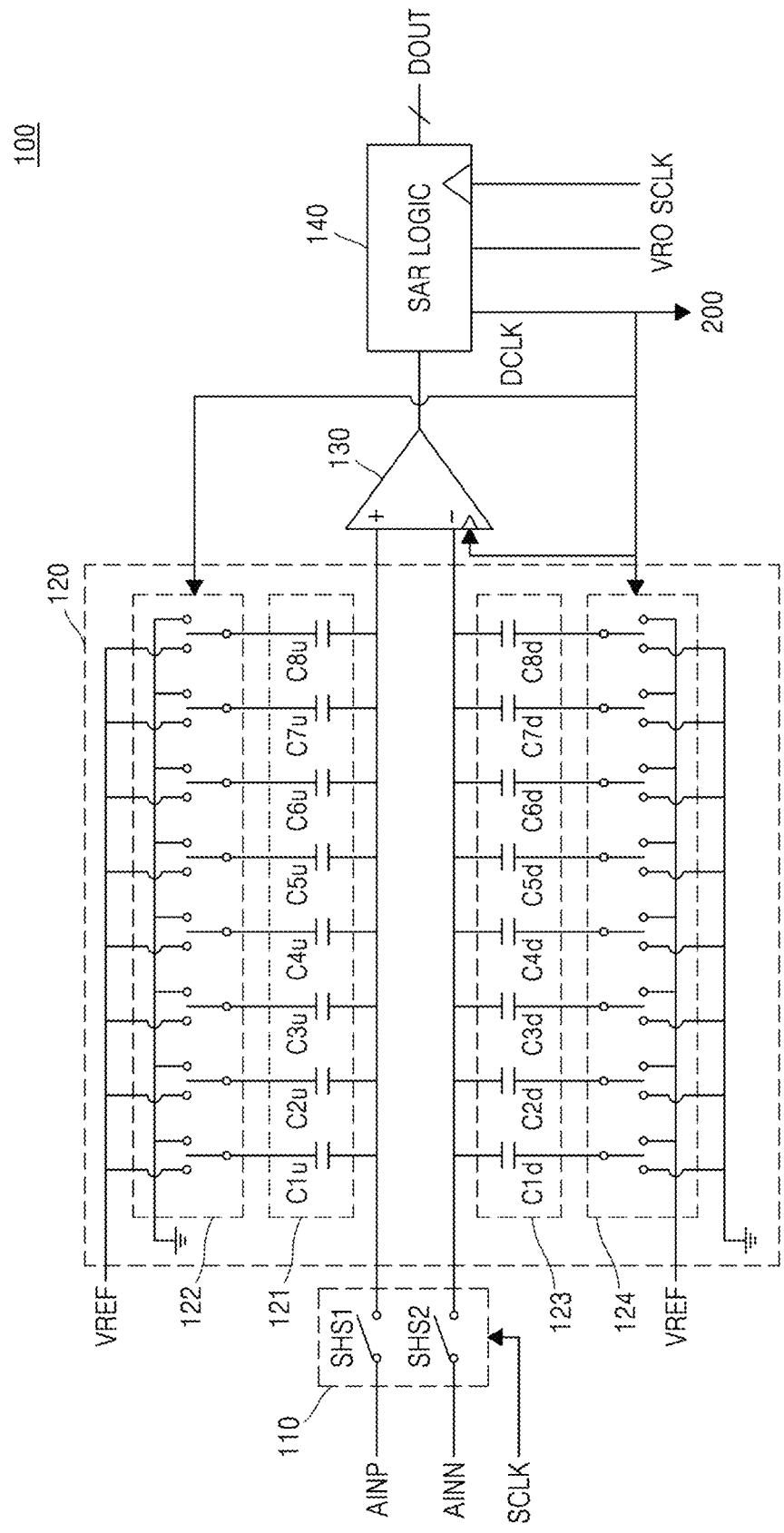
FIGS. 2A and 2B are diagrams for describing an analog-to-digital converter according to some example embodiments.
Figure 2B:
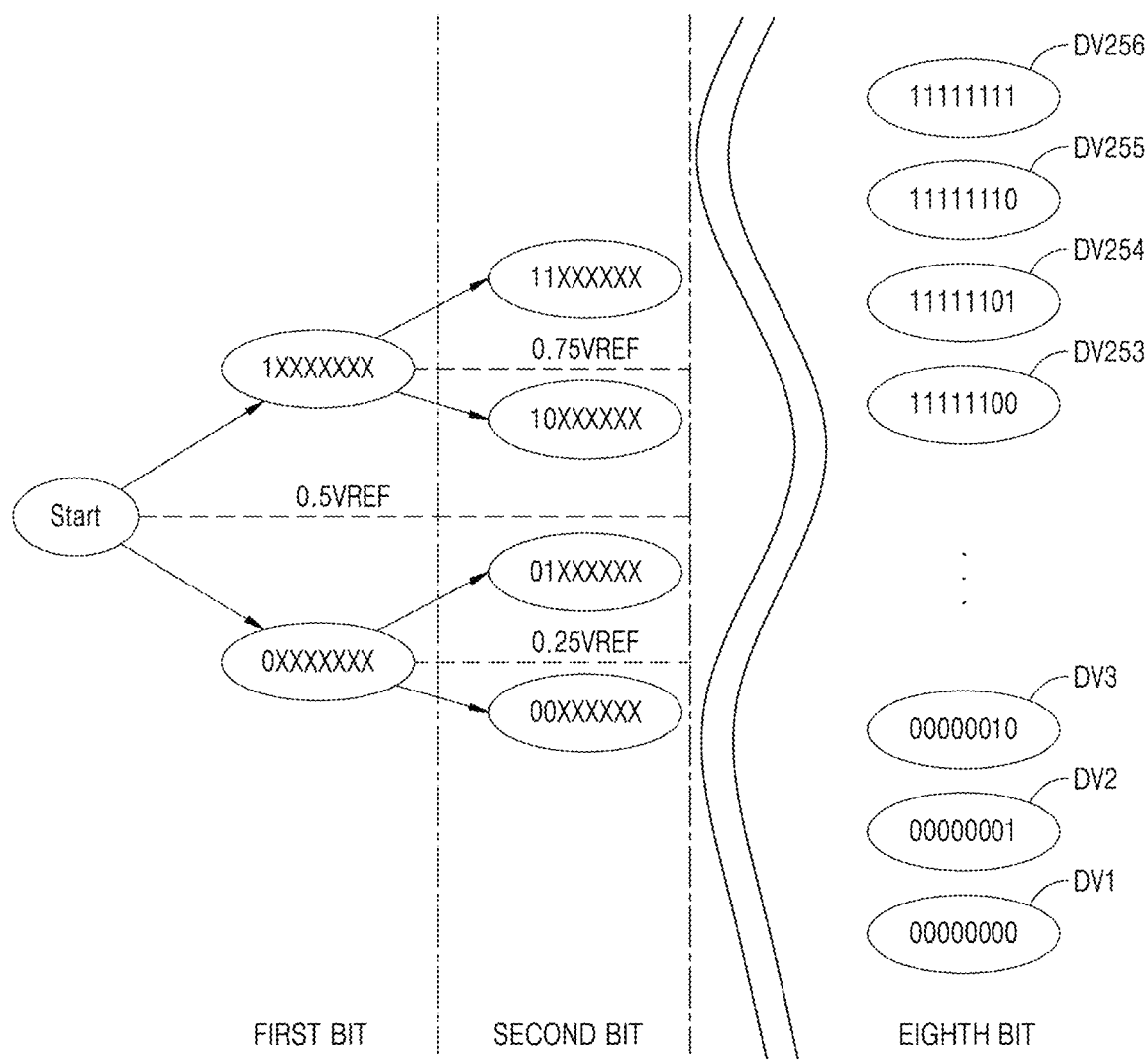

FIGS. 2A and 2B are diagrams for describing the ADC 100 according to some example embodiments. FIG. 2A is a block diagram of the ADC 100 according to some example embodiments. FIG. 2B is a diagram of a process, in which the ADC 100 converts an analog signal to a digital signal by comparing N bits (N is a natural number of 1 or more), according to some example embodiments. FIGS. 2A and 2B may be described with reference to FIG. 1, and duplicate descriptions thereof may be omitted.

Referring to FIG. 2A, the ADC 100 may include the SH circuit 110, the DAC 120, the comparator 130, and the SAR logic 140. The input signal AIN received by the ADC 100 may include a single-ended input or a differential input. Although FIG. 2A illustrates an example, in which the input signal AIN is a differential input signal, the example embodiments are not limited thereto. The ADC 100 may generate the output signal DOUT of N bits (N is a natural number of 1 or more) corresponding to the input signal AIN. The ADC 100 described with reference to FIGS. 2A and 2B is assumed to output the output signal DOUT of 8 bits. However, this is for convenience, and the example embodiments are not limited thereto.

The SH circuit 110 may sample the input signal AIN. In some example embodiments, when a differential input signal is received as in FIG. 2A, the input signal AIN may include a positive input signal AINP and a negative input signal AINN, and the SH circuit 110 may receive the positive input signal AINP and the negative input signal AINN to sample the received signals. The SH circuit 110 may include a first sampling switch SHS1 and a second sampling switch SHS2. The SH circuit 110 may operate based on the first clock signal SCLK. For example, the input signal AIN received by the SH circuit 110 may be sampled at the rising edge or falling edge point of the first clock signal SCLK.

The DAC 120 may include a first capacitor array 121, a first switching circuit 122, a second capacitor array 123, and a second switching circuit 124. The first capacitor array 121 may include first through eighth capacitors C1u through C8u. The number (e.g., quantity) of capacitors included in the first capacitor array 121 may be determined according to the resolution of the ADC 100 or the number of bits of the output signal DOUT. For example, when the ADC 100 has an 8-bit resolution, the number of capacitors included in the first capacitor array 121 may be eight, for example, the first through eighth capacitors C1u through C8u. Although the first capacitor array 121 in FIG. 2A is illustrated as including only eight capacitors, the number of capacitors is not limited thereto, and more or less capacitors may be included depending on the resolution of the ADC 100.

The first terminal of each of the first through eighth capacitors C1u through C8u included in the first capacitor array 121 may be connected to a node, to which the positive input signal AINP is applied. The second terminal of each of the first through eighth capacitors C1u through C8u included in the first capacitor array 121 may be connected to the first switching circuit 122.

The first through seventh capacitors C1u through C7u included in the first capacitor array 121 may have capacitances of different magnitudes from each other to differentially distribute charges. In other words, the capacitance of a particular capacitor corresponding to a particular bit of the output signal DOUT may be twice the capacitance of the capacitor corresponding to the lower bit adjacent to the corresponding particular bit. For example, the capacitance of the first capacitor C1u may be twice that of the second capacitor C2u, and the capacitance of the second capacitor C2u may be twice that of the third capacitor C3u. On the other hand, the capacitance of the eighth capacitor C8u may be the same as the capacitance of the seventh capacitor C7u.

The first switching circuit 122 may operate based on the second clock signal DCLK. The first switching circuit 122 may selectively connect any one of the comparison reference voltage VREF and the ground voltage to each capacitor included in the first capacitor array 121 in response to the second clock signal DCLK. In some example embodiments, when the ADC 100 has an 8-bit resolution, the ADC 100 may perform the comparison operation eight times. For example, the first switching circuit 122 may apply any one of the comparison reference voltage VREF and the ground voltage to the first capacitor C1u in response to the second clock signal DCLK. However, the example embodiments are not limited thereto. Whenever the ADC 100 performs the comparison operation corresponding to each bit of the output signal DOUT, a first comparison voltage may be generated by using the first capacitor array 121 and the first switching circuit 122. In this case, the first comparison voltage may be applied to the comparator 130 via the first terminal of the comparator 130 electrically connected to the first capacitor array 121.

The second switching circuit 124 may be connected to the second capacitor array 123. The second switching circuit 124 may operate based on the second clock signal DCLK. The second switching circuit 124 may selectively apply any one of the comparison reference voltage VREF and the ground voltage to each capacitor included in the second capacitor array 123 in response to the second clock signal DCLK.

The second capacitor array 123 may include the same number of capacitors as the first capacitor array 121. For example, when the first capacitor array 121 includes the first through eighth capacitors C1u through C8u, the second capacitor array 123 may also include first through eighth capacitors C1d through C8d. A first terminal of each of the first through eighth capacitors C1d through C8d included in the second capacitor array 123 may be connected to a node, to which the negative input signal AINN is applied. A second terminal of each of the first through eighth capacitors C1d through C8d included in the second capacitor array 123 may be connected to the second switching circuit 124. Whenever the ADC 100 performs the comparison operation corresponding to each bit of the output signal DOUT, a second comparison voltage may be generated by using the second capacitor array 123 and the second switching circuit 124. In this case, the second comparison voltage may be applied to the comparator 130, via the first terminal of the comparator 130 electrically connected to the second capacitor array 123. The second capacitor array 123 may have a configuration similar to that of the first capacitor array 121, and thus, duplicate descriptions thereof are omitted.

The comparator 130 may receive the comparison voltage from the DAC 120, and output a result signal corresponding to the comparison result to the SAR logic 140. In some example embodiments, the comparator 130 may receive the first comparison voltage and the second comparison voltage from the DAC 120. The comparator 130 may perform the comparison operation based on the received first comparison voltage and second comparison voltage.

The comparator 130 may receive the second clock signal DCLK from the SAR logic 140, and perform the comparison operation in response to the second clock signal DCLK. For example, the comparator 130 may perform the comparison operation once every cycle of the second clock signal DCLK.

The SAR logic 140 may generate the output signal DOUT based on the result signal received from the comparator 130. The SAR logic 140 may generate the second clock signal DCLK in response to the first clock signal SCLK. The SAR logic 140 may transmit the generated second clock signal DCLK to the DAC 120, the comparator 130, and the decision counter 210.

The SAR logic 140 may receive the operating voltage VRO from the voltage controller 200. The SAR logic 140 may receive the first clock signal SCLK from the outside (e.g., a PLL that is external to the ADC 100). In some example embodiments, the cycle of the second clock signal DCLK may be inversely proportional to the magnitude of the operating voltage VRO. In some example embodiments, the cycle of the second clock signal DCLK may be less than the cycle of the first clock signal SCLK.

Referring to FIG. 2B, the DAC 120 may update the comparison voltage from the most significant bit (MSB) to the least significant bit (LSB) by using the switching operation of the DAC 120 while performing the conversion operation on the sampled input signal AIN, and may determine data of a digital signal according to the comparison result. For example, when the analog-to-digital conversion operation is performed, a voltage difference between the comparison voltage in the case of performing the conversion operation on a second bit and the comparison voltage in the case of performing the conversion operation on the MSB (a first bit) may be 0.25 VREF, and a voltage difference between the comparison voltage in the case of performing the conversion operation on a third bit and the comparison voltage in the case of performing the conversion operation on the second bit may be 0.125 VREF.

In some example embodiments, when the ADC 100 converts the input signal AIN into a digital signal and outputs the output signal DOUT of 8 bits, the output signal DOUT may correspond to any one of first through $256^{th}$ output voltages DV1 through DV256. The conversion operation of the ADC 100 may be referred to as an 8-bit decision.

When the ADC 100 is deteriorated by PVT, the ADC 100 may not be able to output the output signal DOUT corresponding to the target resolution. For example, even when the ADC 100 is designed to output the 8-bit output signal DOUT, and the ADC 100 is deteriorated by PVT, the output signal DOUT having less than 8 bits (for example, 6 bits or 7 bits) may be output. In this case, the deteriorated performance of the ADC 100 may be improved by adjusting the operating voltage VRO supplied to the ADC 100. According to some example embodiments, the deteriorated performance of the ADC 100 may be improved by adjusting the operating voltage VRO supplied to the ADC 100 by using the voltage controller 200. As a result, the operational performance of the ADC circuit 10 to respond to (e.g., compensate for) PVT-based performance degradation to reduce, minimize, or eliminate performance degradation due to PVT, to thereby mitigate, reduce, minimize, or prevent deterioration of performance by the ADC 100 due to PVT, may be improved, and thus the functionality of the ADC circuit 10 may be improved.

Even when the ADC 100 outputs the output signal DOUT corresponding to the target resolution, the required power may be higher than the design target. In other words, unnecessary power consumption may occur. Accordingly, there may be a need for a method of reducing the power consumed by the ADC 100 by adjusting the voltage supplied to the ADC 100. According to some example embodiments, the power (e.g., power consumption) of the ADC 100 may be optimized (e.g., reduced or minimized) by adjusting the operating voltage VRO supplied to the ADC 100 by using the voltage controller 200. As a result, the operational efficiency (e.g., power efficiency), and thus the functionality of the ADC circuit 10 may be improved.

Figure 3:
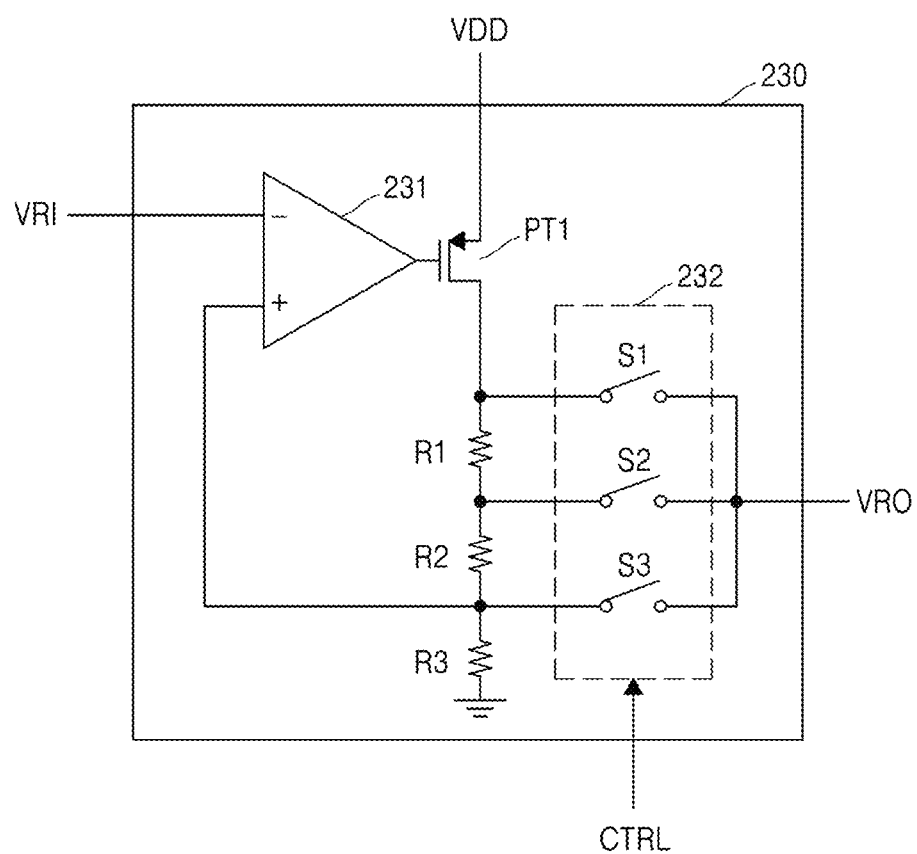
FIG. 3 is a block diagram of a regulator according to some example embodiments.

FIG. 3 is a block diagram of the regulator 230 according to some example embodiments. FIG. 3 may be described with reference to FIG. 1, and duplicate descriptions thereof may be omitted.

The regulator 230 may include an error amplifier 231, a pass transistor PT1, first through third resistors R1 through R3, and a switching circuit 232. The error amplifier 231 may be referred to as an analog error amplifier or an amplifier. In some example embodiments, the regulator 230 may include an LDO regulator.

The regulator 230 may select at least one voltage from the first through $M^{th}$ voltages (M is a natural number of 2 or more) as the operating voltage VRO, and supply (e.g., selectively transmit) the at least one voltage to the ADC 100. Although in FIG. 3 the regulator 230 is illustrated as including three resistors and three switches, this is an example for convenience of explanation, and the regulator 230 may include more or less resistors and switches. Hereinafter, it is assumed that the regulator 230 may generate first through third voltages (e.g., M may be 3).

The error amplifier 231 may receive the regulator reference voltage VRI (also referred to herein as an adjustment reference voltage) from the outside (e.g., at least one external voltage source, such as a power supply). The error amplifier 231 may control the pass transistor PT1 based on the regulator reference voltage VRI and a voltage applied to the node, to which the second resistor R2 and the third resistor R3 are connected.

The pass transistor PT1 may receive the supply voltage VDD from the outside (e.g., at least one external voltage source, such as a power supply, which may be the same source or a different source from which the regulator reference voltage VRI is received). In some example embodiments, the analog-to-digital conversion circuit 10 may further include a power management integrated circuit (PMIC), and the supply voltage VDD and the regulator reference voltage VRI may include voltages generated by the PMIC. Accordingly, in some example embodiments, the regulator 230 may receive the supply voltage VDD and the regulator reference voltage VRI from at least one external voltage source that may include a PMIC. In some example embodiments, the first through $M^{th}$ voltages generated by the regulator 230 may be equal to or greater (e.g., in magnitude) than the regulator reference voltage VRI and less (e.g., in magnitude) than the supply voltage VDD.

In some example embodiments, the first through $M^{th}$ voltages may respectively correspond to voltage levels of M steps, which sequentially increase. In other words, the first voltage of the first through $M^{th}$ voltages may correspond to the lowest voltage level, and the $M^{th}$ voltage may correspond to the highest voltage level. As described herein, a voltage level may be referred to interchangeably as a voltage magnitude.

In some example embodiments, the first through $M^{th}$ voltages may respectively correspond to voltage levels of M steps, which sequentially decrease. In other words, the first voltage of the first through $M^{th}$ voltages may correspond to the highest voltage level, and the $M^{th}$ voltage may correspond to the lowest voltage level. Hereinafter, unless otherwise assumed, it is assumed that the first voltage to the $M^{th}$ voltage respectively correspond to the voltage levels of M steps, which sequentially decrease.

The switching circuit 232 may include first through third switches S1 through S3. The switching circuit 232 may operate according to a control signal of the voltage control logic 220. For example, when the first switch S1 is closed under the control of the voltage control logic 220, the regulator 230 may select the first voltage as the operating voltage VRO. Accordingly, the regulator 230 may selectively transmit the first voltage as the operating voltage VRO and the ADC 100 may operate by receiving the first voltage. For example, when the second switch S2 is closed under the control of the voltage control logic 220, the regulator 230 may select the second voltage as the operating voltage VRO. Accordingly, the regulator 230 may selectively transmit the second voltage as the operating voltage VRO and the ADC 100 may operate by receiving the second voltage. For example, when the third switch S3 is closed under the control of the voltage control logic 220, the regulator 230 may select the third voltage as the operating voltage VRO. Accordingly, the regulator 230 may selectively transmit the third voltage as the operating voltage VRO and the ADC 100 may operate by receiving the third voltage.

When it is determined (e.g., in response to a determination) that the performance of the ADC 100 has deteriorated, the voltage controller 200 may perform a correction operation of changing the operating voltage VRO of the ADC 100 to a corrected supply voltage. When performing the correction operation, the voltage controller 200 may increase or decrease the operating voltage VRO (e.g., control the regulator 230 to increase or decrease the operating voltage VRO) by one step by controlling the regulator 230 by using the voltage control signal CTRL generated by the voltage control logic 220, and in this manner, may select the improved or optimal operating voltage, that is, the corrected operating voltage.

In some example embodiments, the voltage control logic 220 may select the first voltage of the first through $M^{th}$ voltages as the operating voltage VRO, by transmitting the voltage control signal CTRL corresponding to the correction start signal to the regulator 230. In other words, the regulator 230 may select the first voltage as the operating voltage VRO and supply (e.g., selectively transmit) the selected first voltage to the ADC 100, in response to the received voltage control signal CTRL. In this case, the first voltage may include the highest voltage of the first through third voltages generated by the regulator 230.

In some example embodiments, when (e.g., in response to a determination that) the decision count value DCNT received from the decision counter 210 is equal to or greater than the reference count value, the voltage control logic 220 may transmit the voltage control signal CTRL corresponding to the voltage step-down signal to the regulator 230. In response to the received voltage control signal CTRL, the regulator 230 may select a voltage with a voltage level one step lower than the current operating voltage VRO as a new operating voltage VRO (e.g., a changed operating voltage VRO), and supply (e.g., selectively transmit) the selected voltage to the ADC 100. For example, when the first voltage is currently supplied as the operating voltage VRO, the changed operating voltage VRO may include the second voltage.

In some example embodiments, when (e.g., in response to a determination that) the decision count value DCNT received from the decision counter 210 is less than the reference count value, the voltage control logic 220 may increase the operating voltage VRO by one step by transmitting the voltage control signal CTRL corresponding to the voltage step-up signal to the regulator 230. In response to the received voltage control signal CTRL, the regulator 230 may select a voltage with a voltage level one step higher than the current operating voltage VRO as a new operating voltage VRO (e.g., a changed operating voltage VRO), and supply (e.g., selectively transmit) the selected voltage to the ADC 100. For example, when the third voltage is supplied to the ADC 100 as the current operating voltage VRO, the changed operating voltage VRO may include the second voltage. In addition, the voltage control logic 220 may complete the voltage correction operation, by transmitting the voltage control signal CTRL corresponding to the voltage step-up signal to the regulator 230 and then transmitting the voltage control signal CTRL corresponding to the correction completion signal to the regulator 230. In this case, the corrected operating voltage VRO may include the second voltage.

Figure 4:
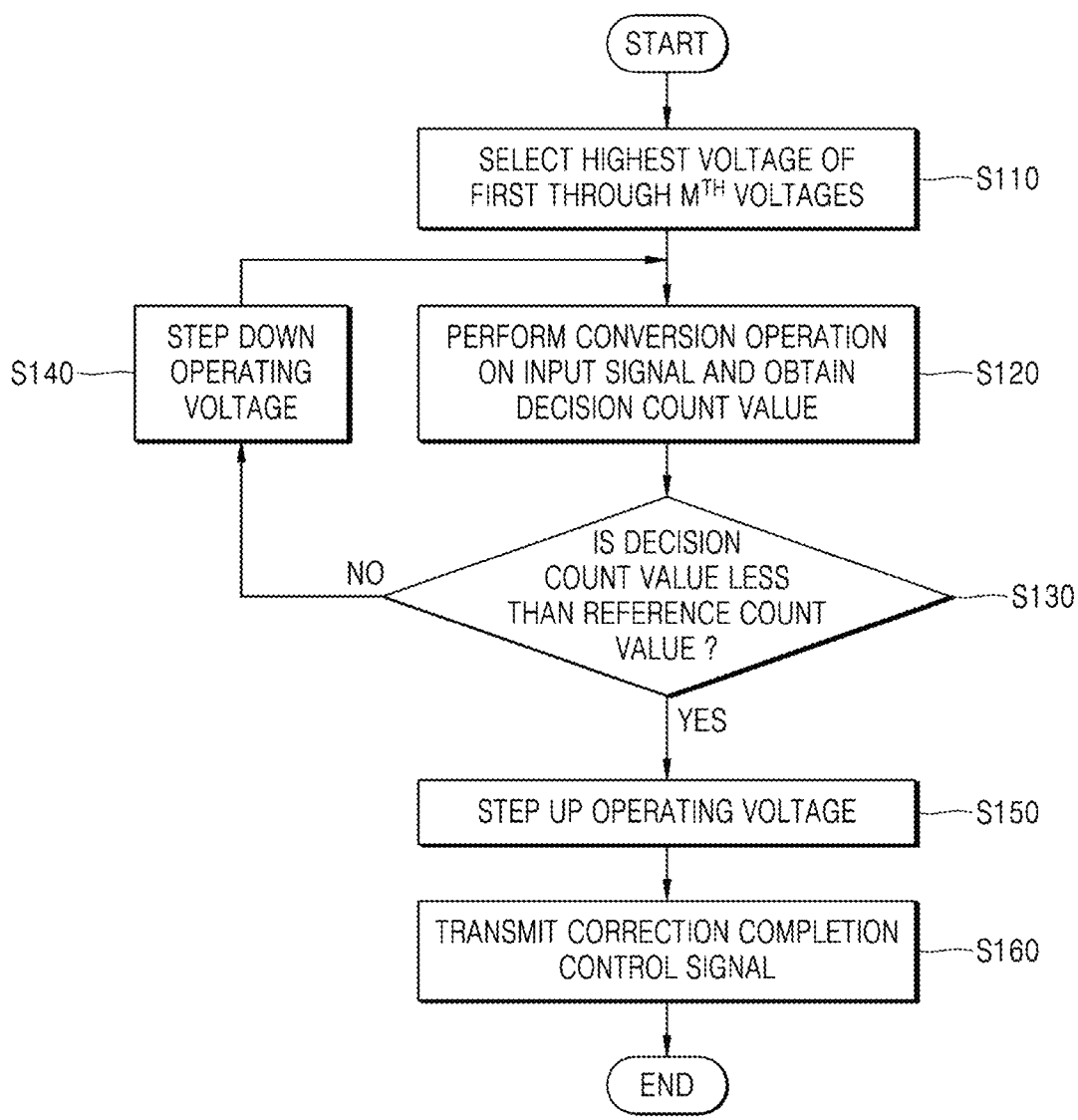
FIG. 4 is a flowchart of a method of correcting an operating voltage of an analog-to-digital converter, according to some example embodiments.

FIG. 4 is a flowchart of an operating method of the voltage controller 200, according to some example embodiments. FIG. 4 is a flowchart to describe a method of searching for the corrected operating voltage corresponding to the improved or optimal operating voltage of the operating voltages VRO supplied to the ADC 100, and supplying the corrected operating voltage to the ADC 100. FIG. 4 may be described with reference to FIGS. 1 through 3, and duplicate descriptions thereof may be omitted.

In FIG. 4, it is assumed that the regulator 230 may select any one voltage of the first through $M^{th}$ voltages as the operating voltage VRO, and supply (e.g., selectively transmit) the selected any one voltage to the ADC 100. In this case, it is assumed that the first through $M^{th}$ voltages may respectively correspond to voltage levels of M steps, which sequentially decrease.

In other words, the first voltage may correspond to the highest voltage level of the first through $M^{th}$ voltages, and the $M^{th}$ voltage may correspond to the lowest voltage level of the first through $M^{th}$ voltages. The case, in which the first through $M^{th}$ voltages respectively correspond to the voltage levels of the M steps, which sequentially increase, is described below with reference to FIG. 6.

In operation S110, the voltage controller 200 may select the highest voltage of the first through $M^{th}$ voltages as the operating voltage VRO, and supply the selected highest voltage to the ADC 100. In some example embodiments, the voltage controller 200 may select the first voltage corresponding to the highest voltage of the first through $M^{th}$ voltages as the operating voltage VRO, and supply the selected first voltage to the ADC 100.

In operation S120, the ADC 100 may perform the conversion operation of converting the input signal AIN into the output signal DOUT, based on the operating voltage VRO supplied by the voltage controller 200, and the voltage controller 200 may obtain (e.g., generate) the decision count value DCNT corresponding to the conversion operation.

In some example embodiments, the ADC 100 may generate the second clock signal DCLK during one cycle of the first clock signal SCLK received from the outside. The ADC 100 may perform the conversion operation of converting the input signal AIN into the output signal DOUT based on the generated second clock signal DCLK. The ADC 100 may transmit the second clock signal DCLK to the voltage controller 200. The voltage controller 200 may count the number of times, at which the transmitted second clock signal DCLK is applied to the decision counter 210 (e.g., the number of times the second clock signal DCLK is received at the decision counter 210 between a falling edge time point of a given cycle of the first clock signal SCLK and a rising edge time point of a next cycle of the first clock signal SCLK). For example, when the ADC 100 has an 8-bit resolution and the second clock signal DCLK is applied to the decision counter 210 eight times (e.g., received at the decision counter 210 eight times during one cycle of the first clock signal SCLK), the decision count value DCNT may be 8, and the output signal DOUT may also include 8 bits. However, even though the ADC 100 has the 8-bit resolution, when the performance deteriorates, the number of times at which the second clock signal DCLK is applied to the decision counter 210 (e.g., received at the decision counter 210 during one cycle of the first clock signal SCLK) may be less than 8. In this case, when it is assumed that the number of times at which the second clock signal DCLK is applied to the decision counter 210 is seven, the decision count value DCNT may be 7, and the output signal DOUT may also include 7 bits.

In operation S130, the voltage controller 200 may compare the decision count value DCNT with the reference count value, and determine to either increase or decrease the operating voltage VRO based on the comparison result. In some example embodiments, when the decision count value DCNT is equal to or greater than the reference count value, the voltage controller 200 may determine to decrease the operating voltage VRO supplied to the ADC 100. In other words, the operating voltage VRO may be stepped down. In some example embodiments, when the decision count value DCNT is less than the reference count value (S140=NO), the voltage controller 200 may determine to increase the operating voltage VRO supplied to the ADC 100. In other words, the operating voltage VRO may be stepped up.

In operation S140, when the voltage controller 200 determines to decrease the operating voltage VRO supplied to the ADC 100, the operating voltage VRO may be changed so that a voltage lower by one step than the current operating voltage VRO of the first through $M^{th}$ voltages becomes a new operating voltage VRO (e.g., a changed operating voltage VRO). In some example embodiments, after operation S140 is completed, the voltage controller 200 may initialize (e.g., reset to a value of zero (0)) the decision count value DCNT and may repeat operations S120 and S130. In some example embodiments, the voltage controller 200 may initialize the decision count value DCNT in response to adjusting the operating voltage VRO (e.g., at S140 and/or S150). In some example embodiments, the voltage controller 200 may initialize the decision count value DCNT in response to outputting the control signal CTRL to the regulator 230.

Operations S120 and S130 may be repeatedly performed (e.g., operations S120, S130, and S140 may be repeatedly performed) until the decision count value becomes less than the reference count value (S140=YES). In some example embodiments, the ADC 100 may perform the conversion operation of operation S120 again based on the changed operating voltage VRO. The voltage controller 200 may obtain again the decision count value corresponding to the conversion operation. In operation S130, the voltage controller 200 may compare the newly counted decision count value with the reference count value, and determine to increase or decrease the operating voltage VRO based on the comparison result.

In operation S150, when the voltage controller 200 determines to increase the operating voltage VRO supplied to the ADC 100, the operating voltage VRO may be changed so that a voltage higher by one step than the current operating voltage VRO of the first through $M^{th}$ voltages becomes a new operating voltage VRO (e.g., a changed operating voltage VRO).

In operation S160, the voltage controller 200 may determine the operating voltage VRO changed in operation S150 as the corrected operating voltage.

Figure 5A:
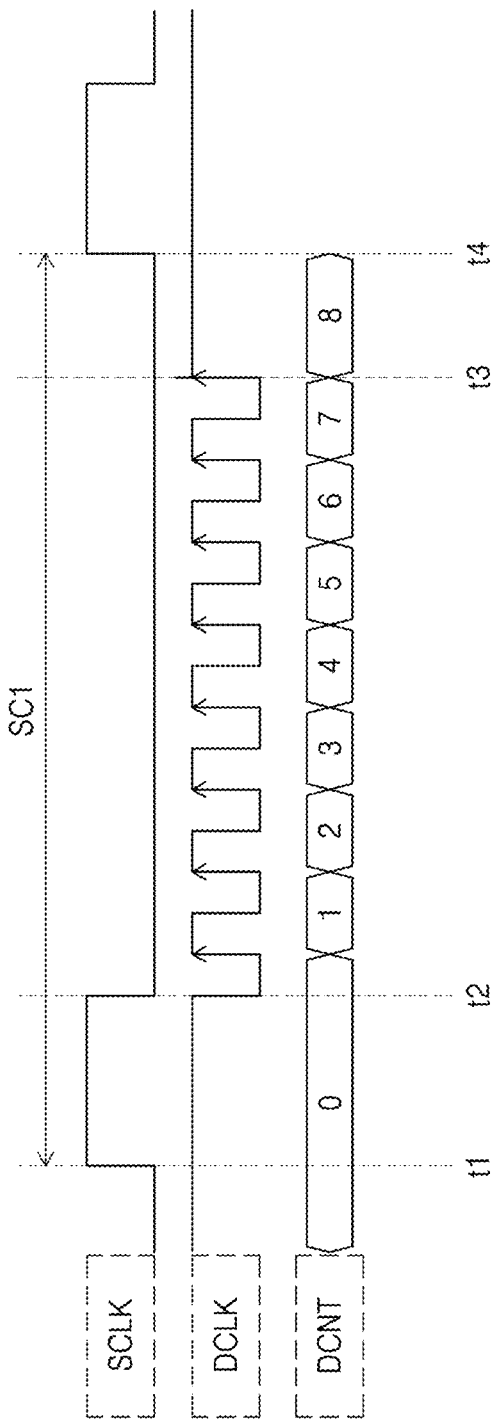
FIGS. 5A, 5B, and 5C are timing diagrams of a method of correcting an operating voltage of an analog-to-digital converter, according to some example embodiments.
Figure 5B:
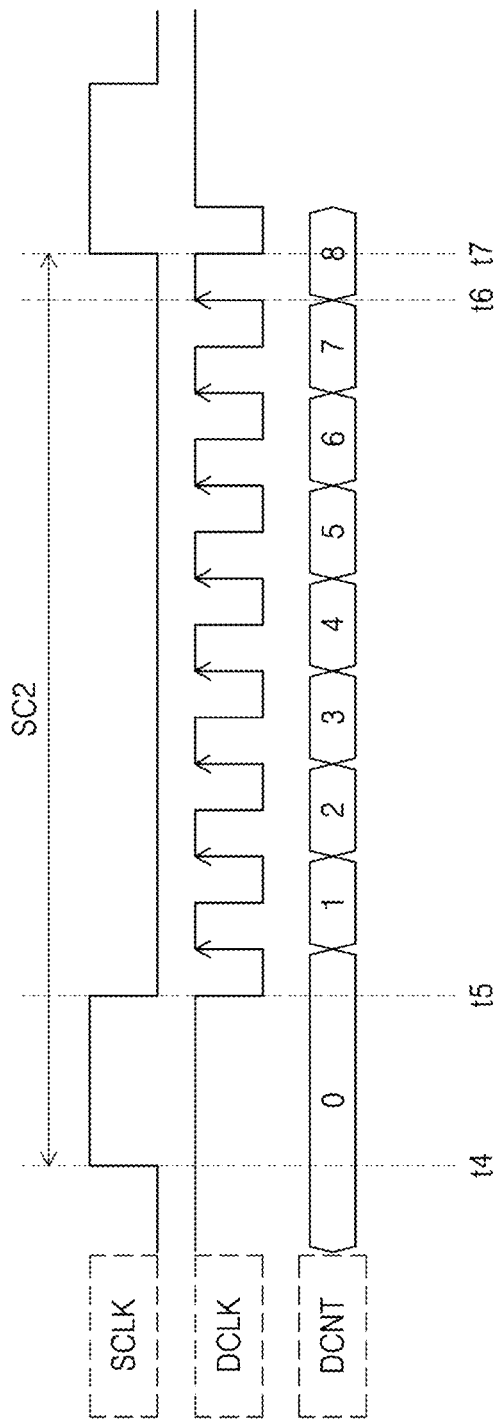
Figure 5C:
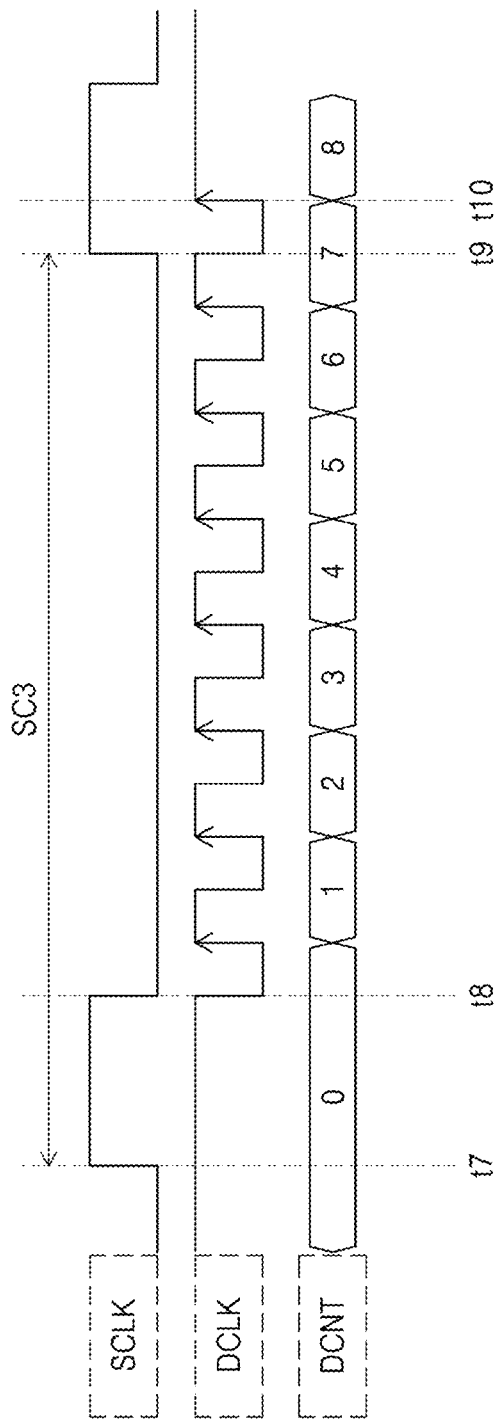

FIGS. 5A, 5B, and 5C are timing diagrams of a method of correcting the operating voltage VRO of the ADC 100, according to some example embodiments. FIGS. 5A through 5C may be described with reference to FIGS. 1 through 4, and duplicate descriptions thereof may be omitted.

In FIGS. 5A through 5C, it is assumed that the ADC 100 has an 8-bit resolution. In other words, the reference count value may be 8. In addition, the regulator 230 may generate the first through $M^{th}$ voltages, and it is assumed that the first through $M^{th}$ voltages respectively correspond to voltage levels of M steps, which sequentially decrease. In other words, the first voltage may include the highest voltage of the first through $M^{th}$ voltages. In addition, in FIGS. 5A through 5C, the decision count value is illustrated to be updated at the rising edge time point of the second clock signal DCLK, but this is an example, and the decision count value may also be updated at the falling edge time point of the second clock signal DCLK.

In FIGS. 5A through 5C, a first cycle SC1 of the first clock signal SCLK may mean a time interval from a first time point t1 to a fourth time point t4, the second cycle SC2 thereof may mean a time interval from the fourth time point t4 to a seventh time point t7, and a third cycle SC3 thereof may mean a time interval from the seventh time point t7 to a ninth time point t9. In this case, the first cycle SC1, the second cycle SC2, and the third cycle SC3 may include time intervals of the same length.

Although in FIGS. 5A through 5C, for convenience of descriptions, the corrected operating voltage (that is, the optimal operating voltage) is illustrated to be searched for during three cycles of the first clock signal SCLK, this is an example, and more or less cycles may be required.

FIG. 5A may correspond to operations S110 through S130 in FIG. 4. For example, because the decision count value DCNT is less than the reference count value, the voltage controller 200 may determine to correct the operating voltage VRO of the ADC 100. Accordingly, the voltage control logic 220 may transmit the voltage control signal CTRL corresponding to the correction start signal to the regulator 230.

Referring to FIG. 5A, the voltage controller 200 may select the first voltage as the operating voltage VRO of the ADC 100. In some example embodiments, the SH circuit 110 may sample the input signal AIN at the rising edge of the first clock signal SCLK. For example, at the first time point t1 in FIG. 5A, the fourth time point t4 in FIG. 5B, and the seventh time point t7 in FIG. 5C, the SH circuit 110 may sample the input signal AIN.

In some example embodiments, at a second time point t2, that is, at the falling edge of the first cycle SC1 of the first clock signal SCLK, the SAR logic 140 may start to generate the second clock signal DCLK. The ADC 100 may sequentially perform the conversion operation of converting the input signal AIN into the output signal DOUT according to the second clock signal DCLK generated by the SAR logic 140. For example, the ADC 100 may determine the MSB of the output signal DOUT in the first cycle SC1 of the second clock signal DCLK, and may determine the LSB of the output signal DOUT in an eighth cycle of the second clock signal DCLK.

The decision counter 210 may sequentially increase the decision count value DCNT each time when the second clock signal DCLK is applied. In some example embodiments, each time when the rising edge of the second clock signal DCLK is applied to the decision counter 210, the decision count value DCNT may be increased by 1.

At a third time point t3, the ADC 100 may complete a conversion operation on the input signal AIN into the output signal DOUT corresponding to a digital signal. In this case, the decision count value DCNT may be 8. The fact that the decision count value DCNT is equal to or greater than the reference count value in the voltage controller 200 may mean that a voltage higher than necessary is supplied. This case may mean that because the conversion operation is completed before the first cycle SC1 of the first clock signal SCLK has passed, a voltage higher than necessary is applied. Accordingly, the voltage controller 200 may determine to reduce the voltage supplied to the ADC 100.

FIG. 5B is a timing diagram corresponding to re-performing operations S120 and S130 after operation S140 in FIG. 4. Because the voltage controller 200 determines to decrease the voltage supplied to the ADC 100 in FIG. 5A, the voltage controller 200 may select the second voltage lower than the first voltage by one step as the operating voltage VRO during the second cycle SC2 of the first clock signal SCLK, and supply the selected second voltage to the ADC 100.

In FIG. 5B, the decision count value DCNT may be 8 at a sixth time point t6 at which an operation of converting the input signal AIN into the output signal DOUT is completed. Similar to the case of FIG. 5A, this case may mean that because the conversion operation is completed before the first cycle SC1 of the first clock signal SCLK has passed, a voltage higher than necessary is applied. Accordingly, the voltage controller 200 may determine to reduce the voltage supplied to the ADC 100.

Because the voltage controller 200 determines to reduce the voltage supplied to the ADC 100 in FIG. 5B, in FIG. 5C, the voltage controller 200 may select the third voltage less than the second voltage by one step as the operating voltage VRO, and supply the selected third voltage to the ADC 100.

Referring to FIG. 5C, the decision count value DCNT may be 7 at a ninth time point t9, at which the third cycle SC3 of the first clock signal SCLK ends. In other words, the ADC 100 may complete the conversion operation on the input signal AIN only at the tenth time point t10. Accordingly, because at the ninth time point t9, at which the third cycle SC3 of the first clock signal SCLK ends, the voltage control logic 220 may compare the decision count value DCNT with the reference count value, and because the decision count value DCNT is less than the reference count value, the voltage control logic 220 may determine to increase the voltage supplied to the ADC 100. In other words, even though the ADC 100 is designed to have the 8-bit resolution, because the voltage has been excessively reduced, the output signal DOUT of 7 bits may have been generated. Accordingly, the voltage controller 200 may determine to increase the voltage supplied to the ADC 100. Because the voltage controller 200 determines to increase the voltage supplied to the ADC 100, the voltage controller 200 may select the second voltage higher than the third voltage by one step as the operating voltage VRO. As examined with reference to FIG. 5B, when the ADC 100 operates by using the second voltage, the whole output signal DOUT having 8 bits corresponding to the resolution of the ADC 100 may be output. Accordingly, the voltage controller 200 may determine the second voltage as the corrected operating voltage. The voltage control logic 220 may transmit the voltage control signal CTRL corresponding to the correction completion signal to the regulator 230, and may complete correction of the operating voltage of the ADC 100.

Figure 6:
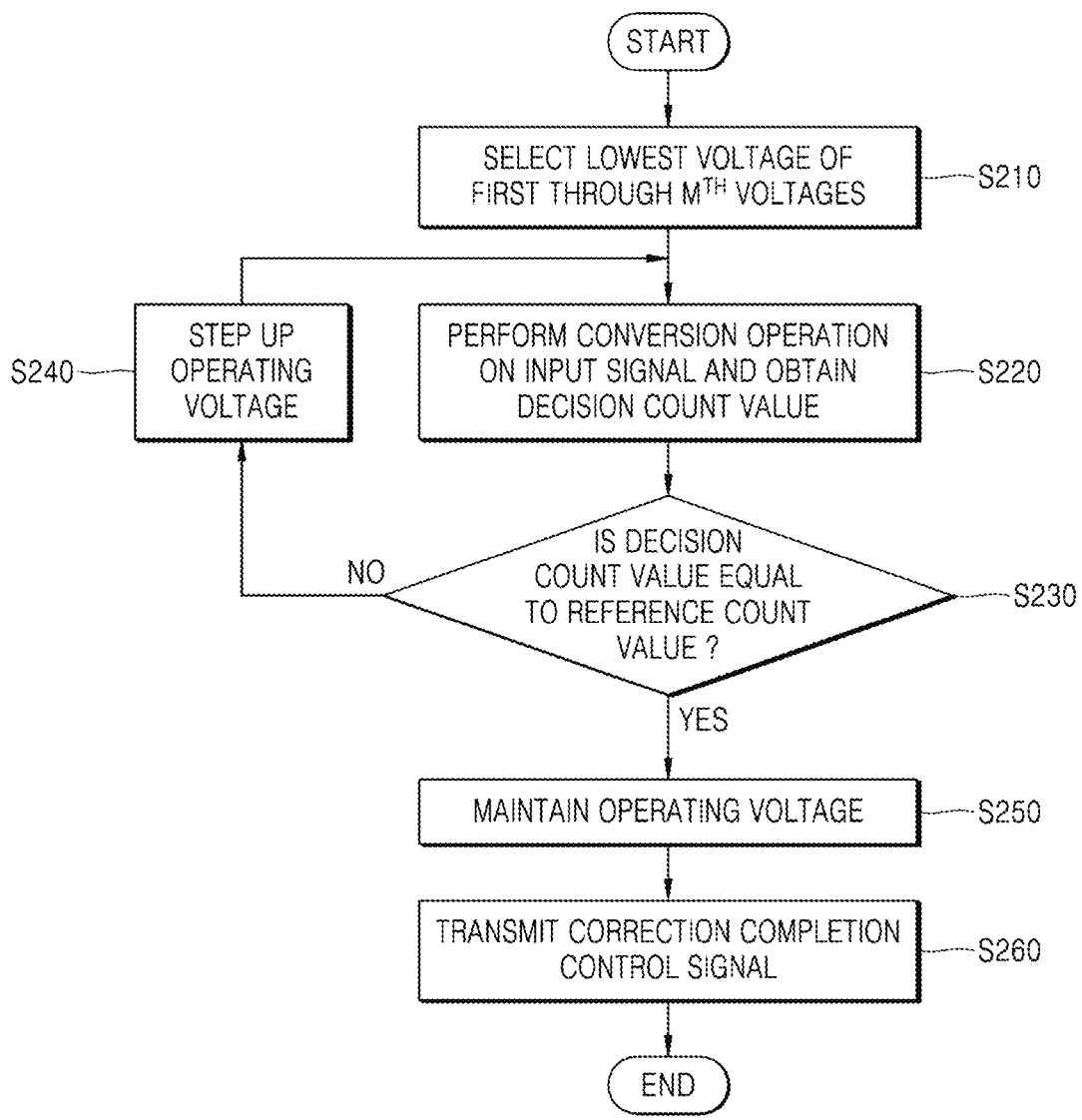
FIG. 6 is a flowchart of a method of correcting an operating voltage of an analog-to-digital converter, according to some example embodiments.

FIG. 6 is a flowchart of a method of correcting the operating voltage VRO of the ADC 100, according to some example embodiments. FIG. 6 is a flowchart to describe a method of searching for the corrected operating voltage corresponding to the optimal operating voltage of the operating voltages VRO supplied to the ADC 100, and supplying the corrected operating voltage to the ADC 100. FIG. 6 may be described with reference to FIGS. 1 through 4, and duplicate descriptions thereof may be omitted.

In FIG. 6, it is assumed that the regulator 230 may select any one voltage of the first through $M^{th}$ voltages as the operating voltage VRO, and supply the selected voltage to the ADC 100. In this case, unlike described with reference to FIG. 4, it is assumed that the first through $M^{th}$ voltages in FIG. 6 may respectively correspond to voltage levels of M steps, which sequentially increase. In other words, the first voltage may correspond to the lowest voltage level of the first through $M^{th}$ voltages, and the $M^{th}$ voltage may correspond to the highest voltage level thereof.

In operation S210, the voltage controller 200 may select the lowest voltage of the first through $M^{th}$ voltages as the operating voltage VRO, and supply the selected highest voltage to the ADC 100. In some example embodiments, the voltage controller 200 may select the first voltage corresponding to the lowest voltage of the first through $M^{th}$ voltages as the operating voltage VRO, and supply the selected first voltage to the ADC 100.

In operation S220, the ADC 100 may perform the conversion operation of converting the input signal AIN into the output signal DOUT, based on the operating voltage VRO supplied by the voltage controller 200, and the voltage controller 200 may obtain the decision count value corresponding to the conversion operation.

In operation S230, the voltage controller 200 may compare the decision count value DCNT with the reference count value, and determine to either increase or maintain the operating voltage VRO based on the comparison result. In some example embodiments, when the decision count value DCNT is not equal to the reference count value, the voltage controller 200 may determine to increase the operating voltage VRO supplied to the ADC 100. In some example embodiments, when the decision count value DCNT is not equal to the reference count value, the voltage controller 200 may determine to maintain the operating voltage VRO supplied to the ADC 100.

In operation S240, when the voltage controller 200 determines to increase the operating voltage VRO supplied to the ADC 100, the operating voltage VRO may be changed so that a voltage higher by one step than the current operating voltage VRO of the first through $M^{th}$ voltages becomes a new operating voltage VRO (e.g., a changed operating voltage VRO). For example, when the current operating voltage VRO includes the second voltage, the voltage controller 200 may supply the third voltage as the operating voltage VRO to the ADC 100.

In some example embodiments, after operation S240 is completed, the voltage controller 200 may initialize (e.g., reset to a value of zero (0)) the decision count value DCNT. Operations S220 and S230 may be repeatedly performed until the decision count value DCNT becomes equal to the reference count value.

In operation S250, when the voltage controller 200 determines to maintain the operating voltage VRO supplied to the ADC 100 in operation S230, the voltage controller 200 may not increase or decrease the operating voltage VRO but maintain the operating voltage VRO.

For example, when the current operating voltage VRO includes the second voltage, the voltage controller 200 may continuously supply the second voltage to the ADC 100.

In operation S260, the voltage controller 200 may determine the operating voltage VRO, which has been determined to be maintained in operation S250, as the corrected operating voltage.

Figure 7:
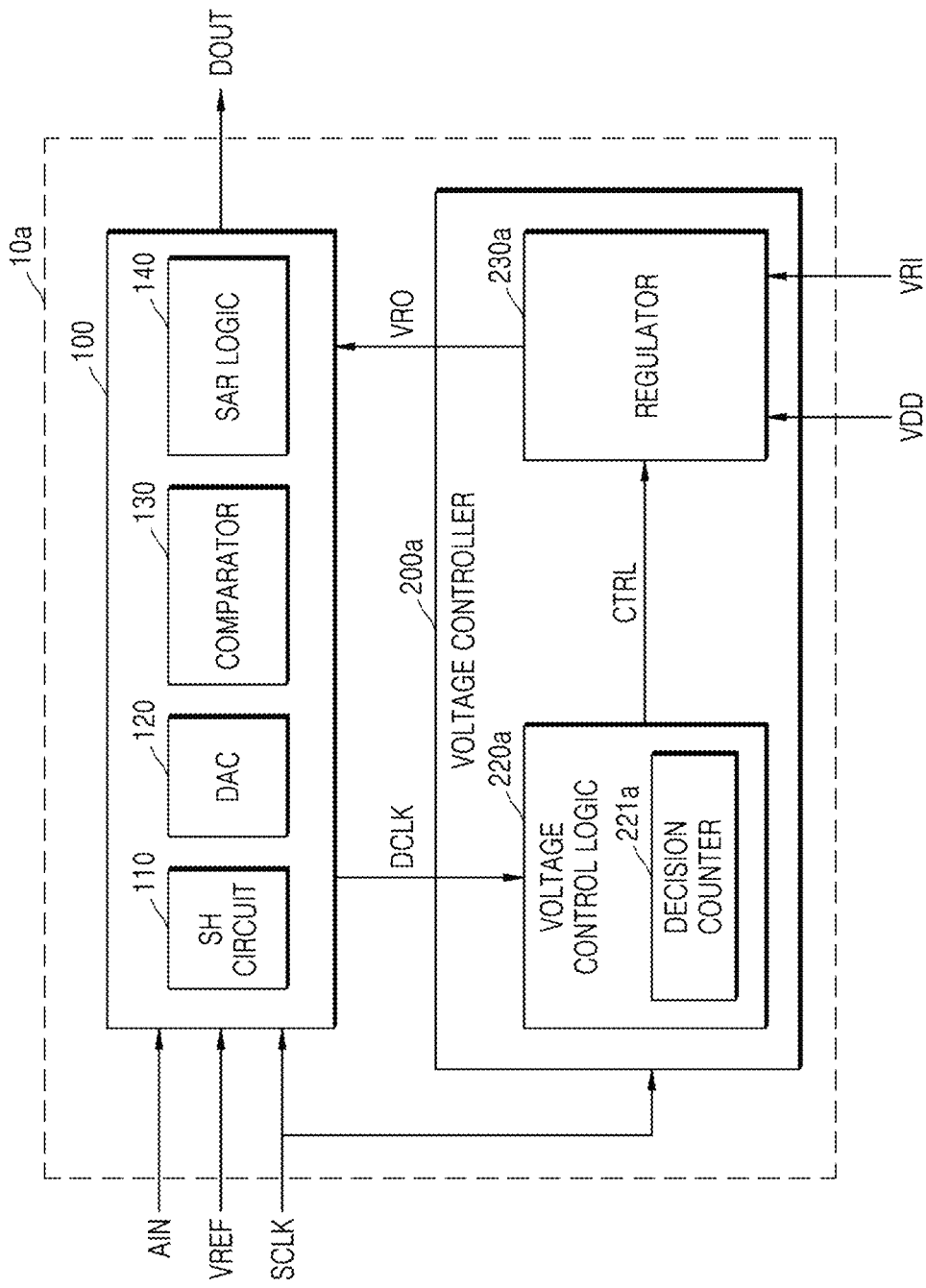
FIG. 7 is a block diagram of an analog-to-digital conversion circuit according to some example embodiments.

FIG. 7 is a block diagram of an analog-to-digital conversion circuit 10*a* according to some example embodiments. FIG. 7 may be described with reference to FIG. 1, and duplicate descriptions thereof may be omitted.

Referring to FIG. 7, the ADC 10*a* may include the ADC 100 and a voltage controller 200*a*. The ADC 100 in FIG. 7 may have the same structure as the ADC 100 in FIG. 1. In other words, the ADC 100 in FIG. 7 may also include the SH circuit 110, the DAC 120, the comparator 130, and the SAR logic 140. The ADC 100 may receive the input signal AIN, the comparison reference voltage VREF, and the first clock signal SCLK from the outside. The ADC 100 may receive the operating voltage VRO from the voltage controller 200*a*. The ADC 100 may generate the second clock signal DCLK, and transmit the second clock signal DCLK to the voltage controller 200*a*. The ADC 100 may convert the input signal AIN received from the outside into a digital signal, and output the digital signal as the output signal DOUT.

The voltage controller 200*a* in FIG. 7 may include a voltage control logic 220*a* and a regulator 230*a*. The voltage controller 200*a* may receive the supply voltage VDD and the regulator reference voltage VRI from the outside. The voltage control logic 220*a* in FIG. 7 may correspond to the voltage control logic 220 in FIG. 1. However, voltage control logic 220*a* may include a decision counter 221*a*. Accordingly, the voltage control logic 220*a* may receive the second clock signal DCLK from the ADC 100. The voltage control logic 220*a* may generate the decision count value DCNT based on the received second clock signal DCLK. The voltage control logic 220*a* may compare the generated decision count value DCNT with the reference count value, and transmit the voltage control signal CTRL to the regulator 230*a* based on the comparison result. In some example embodiments, the reference count value may include a value pre-input to the voltage control logic 220*a* (e.g., stored at a memory included in the voltage control logic 220*a*, stored at a memory of the ADC 10*a* which may be accessed by the voltage control logic 220*a*, etc.).

The regulator 230*a* in FIG. 7 may correspond to the regulator 230 in FIG. 1. The regulator 230*a* may receive a voltage control signal CTRL from the voltage control logic 220*a*, and supply the operating voltage VRO to the ADC 100 based on the received voltage control signal CTRL.

Figure 8:
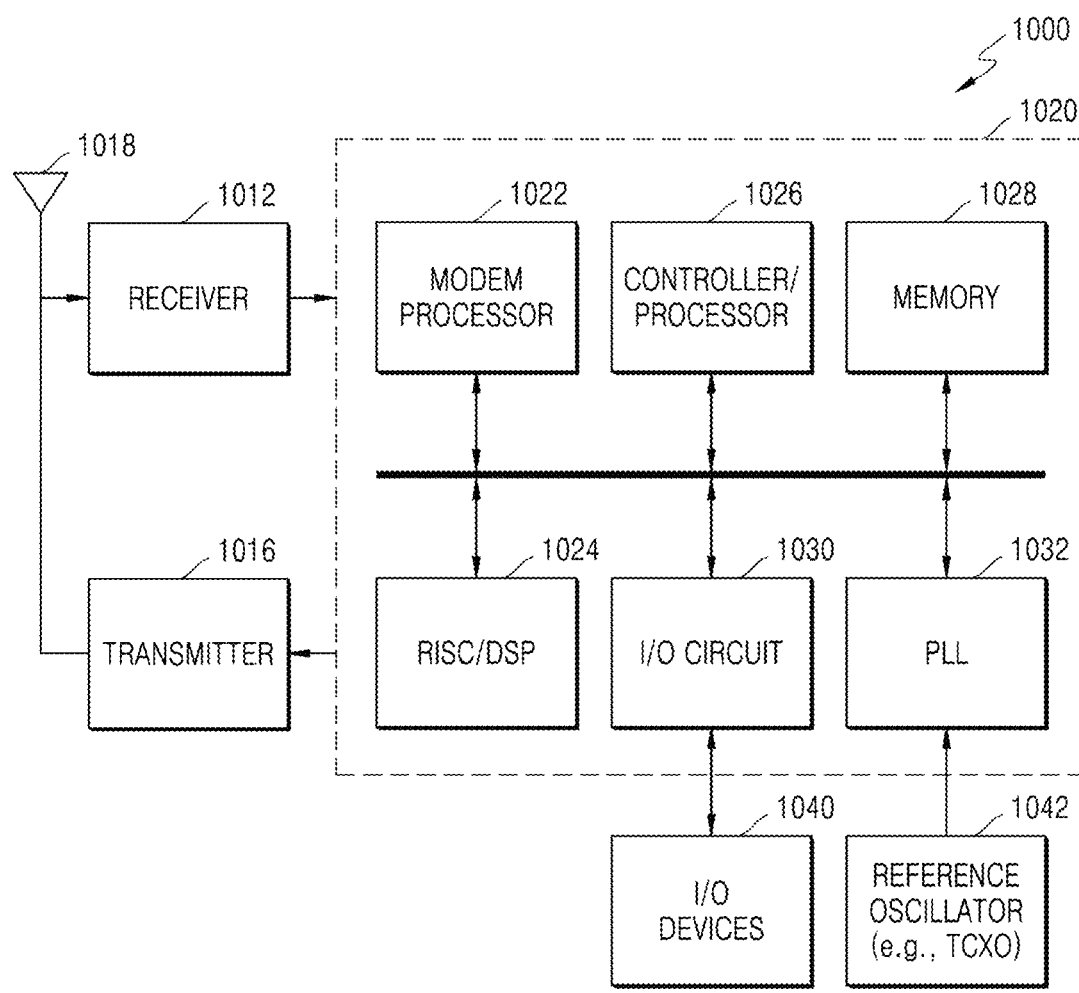
FIG. 8 is a block diagram of a communication device according to some example embodiments.

FIG. 8 is a block diagram of a communication device 1000 according to some example embodiments. FIG. 8 may be described with reference to FIG. 1, and duplicate descriptions thereof may be omitted.

Referring to FIG. 8, the communication device 1000 may include a receiver 1012, a transmitter 1016, a communication module 1020, an antenna 1018, input/output (I/O) device 1040, and a reference oscillator 1042. The receiver 1012 may include the analog-to-digital conversion circuit 10 including the ADC 100 and the voltage controller 200 illustrated in FIG. 1. The receiver 1012 may convert an analog signal received via the antenna 1018 from the outside into a digital signal by using the ADC 100, and then provide the digital signal to the communication module 1020. The transmitter 1016 may convert the digital signal received from the communication module 1020 into an analog signal, and then output the analog signal to the outside via the antenna 1018.

The communication module 1020 may include a modem processor 1022, a reduced instruction set computer/digital signal processor (RISC/DSP) 1024, a controller/processor 1026, a memory 1028, an I/O device 1030, and a PLL 1032.

The modem processor 1022 may perform processing operations, such as encoding, modulation, demodulation, and decoding, for data transmission and data reception. The RISC/DSP 1024 may perform a general or specialized processing operation in the communication device 1000. The controller/processor 1026 may control blocks in the communication module 1020. The memory 1028 may store data and various command code. The I/O device 1030 may communicate with the I/O device 1040, which are outside the I/O device 1030. The I/O device 1030 may convert the data signal received from the outside input/output device 1040 into a digital signal by using the analog-to-digital conversion circuit 10 of FIG. 1. The PLL 1032 may perform a frequency modulation operation by using a frequency signal received from the reference oscillator 1042. The reference oscillator 1042 may be implemented as a crystal oscillator (XO), a voltage controlled crystal oscillator (VCXO), a temperature compensated crystal oscillator (TCXO), etc. The communication module 1020 may perform a processing operation necessary for communication by using output signals generated by the PLL 1032.

Figure 9:
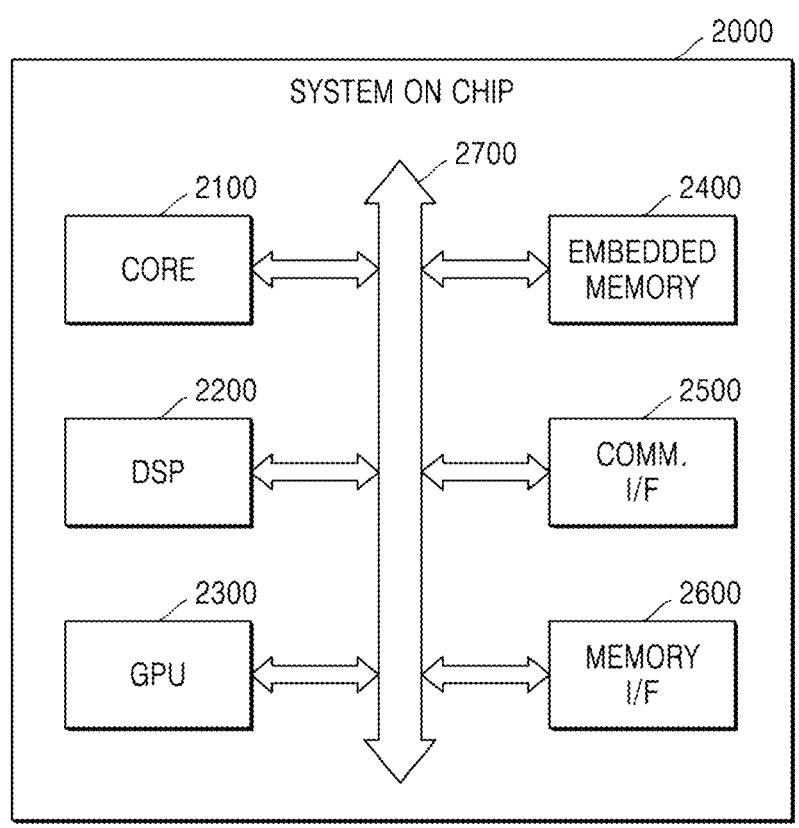
FIG. 9 is a block diagram of a system-on-chip according to some example embodiments.

FIG. 9 is a block diagram of a system-on-chip 2000 according to some example embodiments.

Referring to FIG. 9, the system-on-chip (SoC) 2000 may be referred to as a computing system or an integrated circuit, in which components of another electronic system are integrated. For example, an application processor (AP), as one of the system-on-chips 2000, may include a processor and components for other functions.

The system-on-chip 2000 may include a core 2100, a digital signal processor (DSP) 2200, a graphics processing unit (GPU) 2300, an embedded memory 2400, a communication interface (I/F) 2500, and a memory I/F 2600. Components of the system-on-chip 2000 may communicate with each other via a bus 2700.

The core 2100 may execute commands, and control operations of components included in the system-on-chip 2000. For example, the core 2100 may drive an operating system by executing a series of commands, and execute applications on the operating system. The DSP 2200 may generate useful data by processing a digital signal, for example, a digital signal provided by the communication I/F 2500. The GPU 2300 may also generate data for an image output via a display device from image data provided by the embedded memory 2400 or the memory I/F 2600, and may also encode the image data. The embedded memory 2400 may store data necessary for operations of the core 2100, the DSP 2200, and the GPU 2300. The memory I/F 2600 may provide an I/F to external memories of the system-on-chip 2000, for example, dynamic RAM (DRAM), a flash memory, etc.

The communication I/F 2500 may provide a serial communication with the outside of the system-on-chip 2000. For example, the communication I/F 2500 may be connected to Ethernet, and may include serializer/deserializer (SerDes) for a serial communication.

On the other hand, the analog-to-digital conversion circuit 10, in which the embodiments of the inventive concepts are applied, may be applied to (e.g., included in) the communication I/F 2500 and/or the memory I/F 2600. The communication I/F 2500 or the memory I/F 2600 may receive a data signal based on pulse amplitude modulation with n levels (PAMn), where "n" is any natural number, and convert the data signal to a digital data in a method according to some example embodiments of the inventive concepts.

The bus 2700 may operate based on one of various bus protocols. The various bus protocol may include at least one of advanced microcontroller bus architecture (AMBA) protocol, universal serial bus (USB) protocol, multi-media card (MMC) protocol, peripheral component interconnect (PCI) protocol, PCI-express (PCI-E) protocol, advanced technology attachment (ATA) protocol, serial-ATA protocol, parallel-ATA protocol, small computer system interface (SCSI) protocol, enhanced small disk interface (ESDI) protocol, integrated drive electronics (IDE) protocol, mobile industry processor interface (MIPI) protocol, and universal flash storage (UFS) protocol.

As described herein, any devices, systems, units, blocks, circuits, controllers, and/or portions thereof according to any of the example embodiments (including, for example, the ADC circuit 10, the ADC 100, the SH circuit 110, the DAC 120, the comparator 130, the SAR logic 140, the voltage controller 200, the decision counter 210, the voltage control logic 220, the regulator 230, the ADC circuit 10*a*, the voltage controller 200*a*, the voltage control logic 220*a*, the decision counter 221*a*, the regulator 230*a*, the communication device 1000, the receiver 1012, the transmitter 1016, the communication module 1020, the modem processor 1022, the controller/processor 1026, the memory 1028, the RISC/DSP 1024, the memory 1028, the I/O device 1030, the PLL 1032, the antenna 1018, the I/O device 1040, the reference oscillator 1042, the system-on-chip 2000, the core 2100, the DSP 2200, the GPU 2300, the embedded memory 2400, the communication I/F 2500, the memory I/F 2600, any portion thereof, or the like) may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid-state drive memory device, storing a program of instructions, and a processor (e.g., CPU) configured to execute the program of instructions to implement the functionality and/or methods performed by some or all of any devices, systems, units, blocks, circuits, controllers, and/or portions thereof according to any of the example embodiments.

While the inventive concepts have been particularly shown and described with reference to some example embodiments thereof, it will be understood that various changes in form and details may be made therein without departing from the spirit and scope of the following claims.

What is claimed is:

1. An analog-to-digital conversion circuit, comprising:
   an analog-to-digital converter configured to
      receive an input signal and a first clock signal from an external source that is external to the analog-to-digital converter,
      generate a second clock signal having a different cycle from the first clock signal, and
      output the second clock signal and a digital output signal;
   a decision counter configured to sequentially increase a decision count value each time when the second clock signal received from the analog-to-digital converter is applied to the decision counter;
   a voltage control logic configured to
      receive the decision count value from the decision counter, and
      output a control signal based on a result of comparing the decision count value with a reference count value; and
   a regulator configured to output an operating voltage based on the control signal received from the voltage control logic,
   wherein the analog-to-digital converter is configured to control a cycle of the second clock signal based on a magnitude of the operating voltage, and
   wherein the voltage control logic is configured to control the regulator to output a corrected operating voltage based on using the control signal.

2. The analog-to-digital conversion circuit of claim 1, wherein
   the regulator is configured to generate at least one voltage of first through $M^{th}$ voltages, where M is a natural number of 2 or more, wherein the first through $M^{th}$ voltages respectively correspond to voltage levels of M steps, which sequentially decrease, and
   the analog-to-digital conversion circuit further comprises a switching circuit configured to perform a switching operation so that any one voltage selected from the first through $M^{th}$ voltages is output as the operating voltage based on the control signal.

3. The analog-to-digital conversion circuit of claim 2, wherein
   the regulator is configured to receive a supply voltage and an adjustment reference voltage from at least one external voltage source, and
   the first through $M^{th}$ voltages are less than the supply voltage and equal to or greater than the adjustment reference voltage.

4. The analog-to-digital conversion circuit of claim 2, wherein the analog-to-digital converter comprises:
- a sample/hold circuit configured to sample the input signal;
- a digital-to-analog converter configured to output a comparison voltage based on the sampled input signal;
- a comparator configured to output a result signal based on a magnitude of the comparison voltage; and
- and a successive approximation register (SAR) logic configured to output the digital output signal based on the result signal.

5. The analog-to-digital conversion circuit of claim 4, wherein
- the SAR logic is configured to operate based on the operating voltage,
- the SAR logic is configured to generate the second clock signal during one cycle of the first clock signal to output the generated second clock signal to the comparator and the digital-to-analog converter, and
- the cycle of the second clock signal is less than a cycle of the first clock signal.

6. The analog-to-digital conversion circuit of claim 4, wherein the SAR logic is configured to increase or decrease the cycle of the second clock signal inversely proportional to the magnitude of the operating voltage received from the regulator.

7. The analog-to-digital conversion circuit of claim 4, wherein
- the sample/hold circuit is configured to sample the input signal by operating based on the first clock signal,
- the digital-to-analog converter is configured to output the comparison voltage by operating based on the second clock signal, and
- the comparator is configured to output a result value to the SAR logic by operating based on the second clock signal.

8. The analog-to-digital conversion circuit of claim 1, wherein the decision counter is configured to
- store the decision count value corresponding to a quantity of applications of the second clock signal to the decision counter during one cycle of the first clock signal, and
- output the stored decision count value to the voltage control logic.

9. The analog-to-digital conversion circuit of claim 8, wherein the decision counter is configured to
- output the decision count value to the voltage control logic at a rising edge time point of the first clock signal, and
- initialize the decision count value stored in the decision counter in response to adjusting the operating voltage.

10. The analog-to-digital conversion circuit of claim 5, wherein the voltage control logic is configured to
- control the regulator so that the first voltage of the first through $M^{th}$ voltages becomes the operating voltage during a first cycle of the first clock signal,
- receive, from the decision counter, the decision count value corresponding to a quantity of applications of the second clock signal generated based on the operating voltage during the first cycle, to the decision counter, and
- control the regulator to change the operating voltage to a changed operating voltage that is less than the operating voltage by one step of the first through $M^{th}$ voltages based on generating a voltage regulator reduction signal to control the regulator, in response to a determination that the decision count value is equal to or greater than the reference count value.

11. The analog-to-digital conversion circuit of claim 10, wherein
- the voltage control logic is configured to perform a comparison operation of comparing the decision count value with the reference count value, based on counting a number of applications of the second clock signal having an adjusted cycle that is adjusted based on the changed operating voltage, to the decision counter during a second cycle of the first clock signal, and
- wherein the changing the operating voltage and the comparing the decision count value with the reference count value, performed by the voltage control logic, are repeated until the decision count value becomes less than the reference count value.

12. The analog-to-digital conversion circuit of claim 11, wherein the voltage control logic is configured to control the regulator to change the operating voltage to become the corrected operating voltage that is a voltage higher than the operating voltage by another one step of the first through $M^{th}$ voltages based on generating a voltage increase signal and transmitting the voltage increase signal to the regulator, in response to a determination that the decision count value corresponding to the second clock signal generated based on the changed operating voltage is less than the reference count value.

13. A method of correcting an operating voltage of an analog-to-digital converter, the method comprising:
- selecting a first voltage of first through $M^{th}$ voltages, which sequentially decrease, as the operating voltage;
- obtaining a decision count value corresponding to a second clock signal generated by the analog-to-digital converter operating based on the operating voltage;
- determining to increase or decrease the operating voltage based on a result of comparing the decision count value with a reference count value;
- changing the operating voltage to a changed operating voltage based on the result of the comparing; and
- in response to a determination that the operating voltage is increased, determining the changed operating voltage as a corrected operating voltage,
- wherein the decision count value corresponds to a number of applications of the second clock signal to a voltage controller during one cycle of a first clock signal received from an external source that is external to the analog-to-digital converter.

14. The method of claim 13, wherein the changing of the operating voltage comprises:
- in response to a determination that the decision count value is equal to or greater than the reference count value, determining to decrease the operating voltage, and decreasing the operating voltage so that a decreased operating voltage lower than the operating voltage by one step of the first through $M^{th}$ voltages becomes the changed operating voltage; and
- in response to a determination that the decision count value is less than the reference count value, determining to increase the operating voltage, and increasing the operating voltage so that an increased operating voltage higher than the operating voltage by one step of the first through $M^{th}$ voltages becomes the changed operating voltage.

15. The method of claim 14, wherein the decreasing of the operating voltage comprises:
- initializing the decision count value; and obtaining again the decision count value corresponding to the second clock signal generated by the analog-to-digital converter operating based on the decreased operating voltage.

16. The method of claim 13, wherein
a cycle of the second clock signal is inversely proportional to a magnitude of the operating voltage, and
the cycle of the second clock signal is less than a cycle of the first clock signal.

17. A method of correcting an operating voltage of an analog-to-digital converter, the method comprising:
selecting a first voltage of first through $M^{th}$ voltages, which sequentially increase, as the operating voltage;
obtaining a decision count value corresponding to a second clock signal generated by the analog-to-digital converter operating based on the operating voltage;
determining to increase or maintain the operating voltage based on a result of comparing the decision count value with a reference count value;
increasing or maintaining the operating voltage, based on the result of the comparing; and
in response to a determination that the operating voltage is determined to be maintained, determining the operating voltage as a corrected operating voltage,
wherein the decision count value corresponds to a number of applications of the second clock signal to a voltage controller during a cycle of a first clock signal received from an external source that is external to the analog-to-digital converter.

18. The method of claim 17, wherein the increasing or maintaining of the operating voltage comprises:
in response to a determination that the decision count value matches the reference count value, determining to maintain the operating voltage; and
in response to a determination that the decision count value is less than the reference count value, determining to increase the operating voltage, and increasing the operating voltage so that an increased operating voltage higher than the operating voltage by one step of the first through $M^{th}$ voltages becomes the operating voltage.

19. The method of claim 18, wherein the increasing of the operating voltage comprises:
initializing the decision count value; and
obtaining again the decision count value corresponding to the second clock signal generated by the analog-to-digital converter operating based on the increased operating voltage.

20. The method of claim 17, wherein
a cycle of the second clock signal is inversely proportional to a magnitude of the operating voltage, and
the cycle of the second clock signal is less than the cycle of the first clock signal.

* * * * *